United States Patent
Bateman

(10) Patent No.: US 9,455,368 B2
(45) Date of Patent: Sep. 27, 2016

(54) METHOD OF FORMING AN INTERDIGITATED BACK CONTACT SOLAR CELL

(71) Applicant: Varian Semiconductor Equipment Associates, Inc., Gloucester, MA (US)

(72) Inventor: Nicholas P T Bateman, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/323,035

(22) Filed: Jul. 3, 2014

(65) Prior Publication Data

US 2016/0005914 A1    Jan. 7, 2016

(51) Int. Cl.
*H01L 31/18* (2006.01)
*H01L 31/068* (2012.01)

(52) U.S. Cl.
CPC ....... *H01L 31/1804* (2013.01); *H01L 31/0682* (2013.01); *Y02E 10/50* (2013.01); *Y02P 70/521* (2015.11)

(58) Field of Classification Search
USPC ........................................................ 438/563
See application file for complete search history.

(56) References Cited

U.S. PATENT DOCUMENTS

| 4,152,824 | A | * | 5/1979 | Gonsiorawski | ....... H01L 21/223 136/255 |
| 5,976,939 | A | * | 11/1999 | Thompson | .......... H01L 21/2257 257/E21.151 |
| 6,998,288 | B1 | | 2/2006 | Smith et al. | |
| 2011/0303280 | A1 | * | 12/2011 | Pawlak | ............... H01L 31/1804 136/256 |

* cited by examiner

*Primary Examiner* — Mary Wilczewski
*Assistant Examiner* — Erik T Peterson
(74) *Attorney, Agent, or Firm* — Nields, Lemack & Frame, LLC

(57) ABSTRACT

A method of forming an interdigitated back contact solar cell is described. The method uses a deposition process to create a doped glass layer on the substrate, which, when diffused, created either the emitter or back surface fields. The deposition process may also create an oxide layer on top of the doped glass layer. This oxide layer serves as a mask for a subsequent ion implant. This ion implant directs ions having the opposite conductivity of the doped glass layer into exposed regions of the substrate. A thermal process is used to diffuse the dopant from the doped glass layer into the substrate and repair any damage caused by the ion implant.

16 Claims, 9 Drawing Sheets

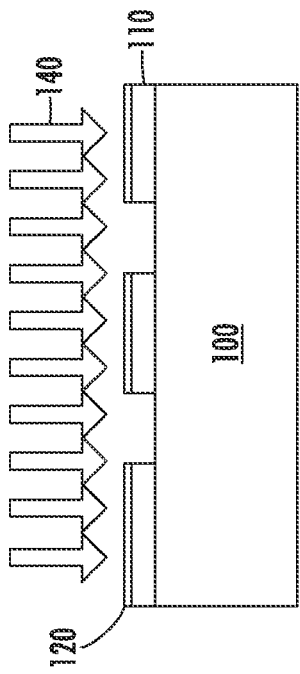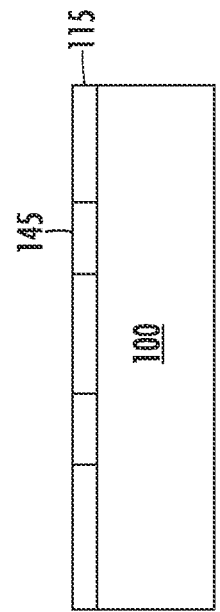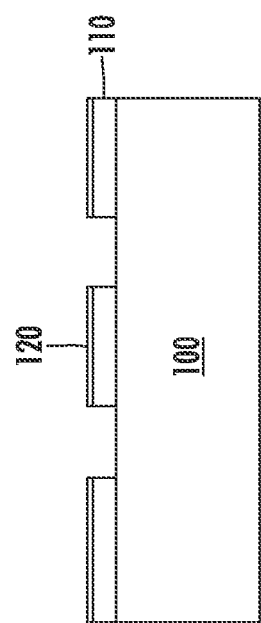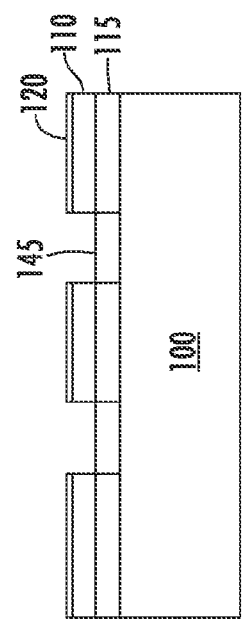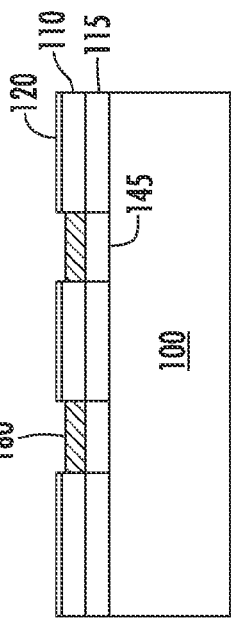

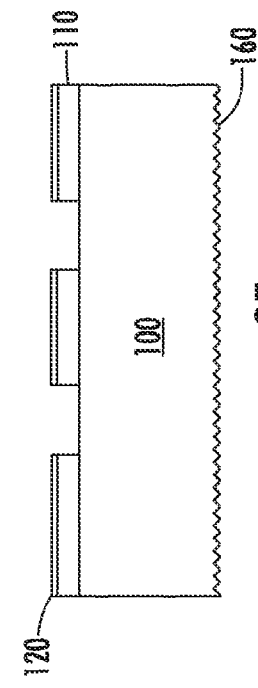
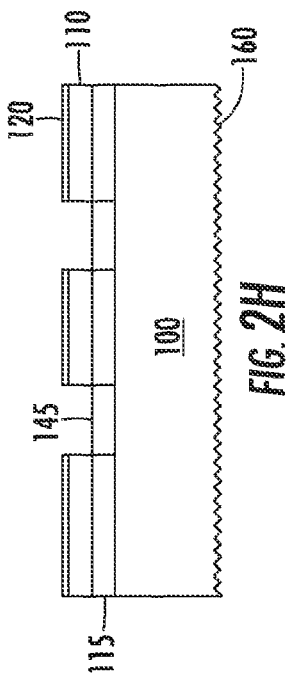
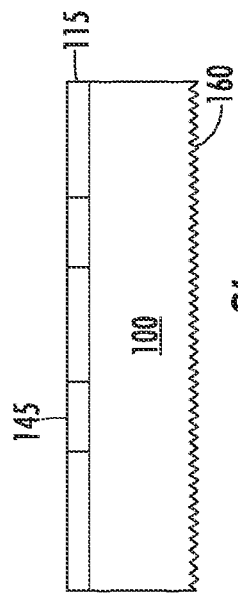
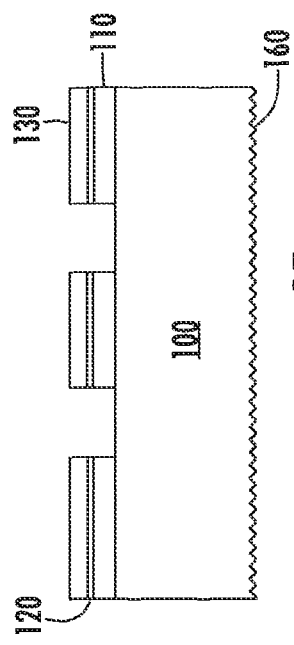
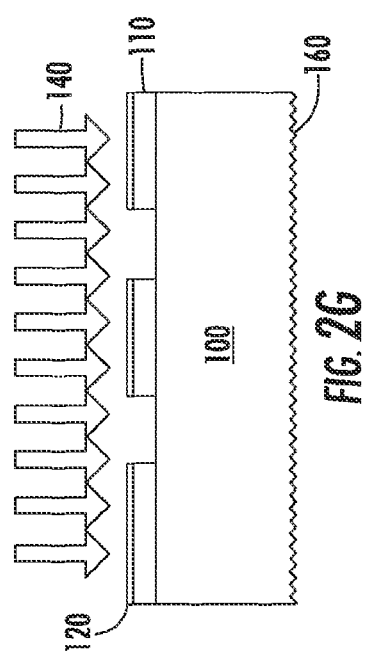

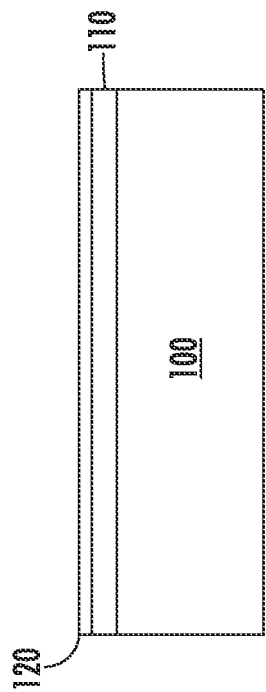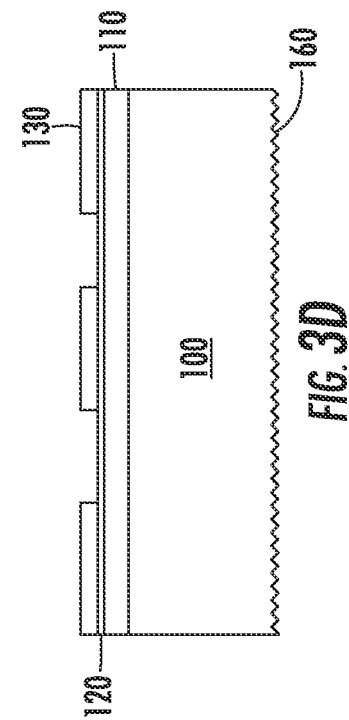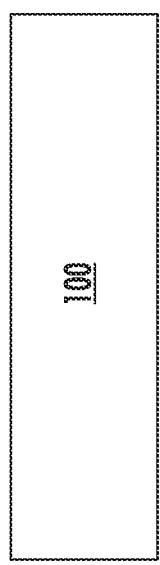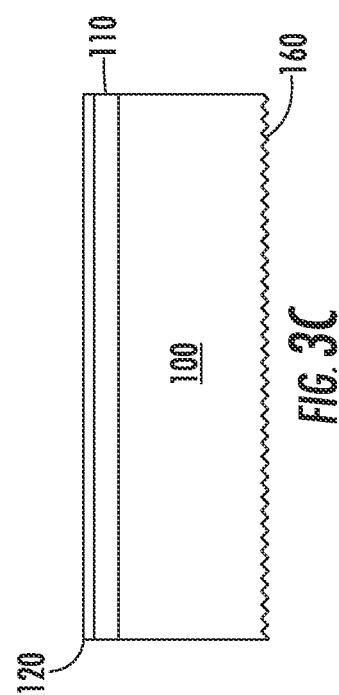

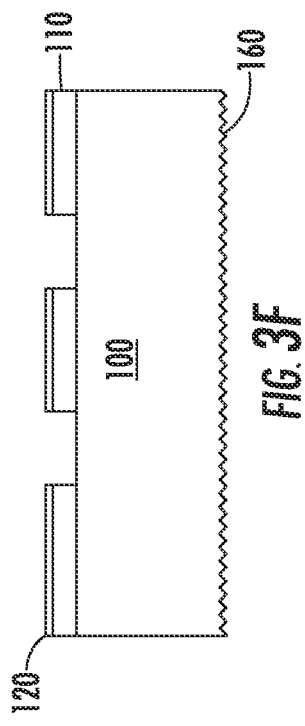
FIG. 3E
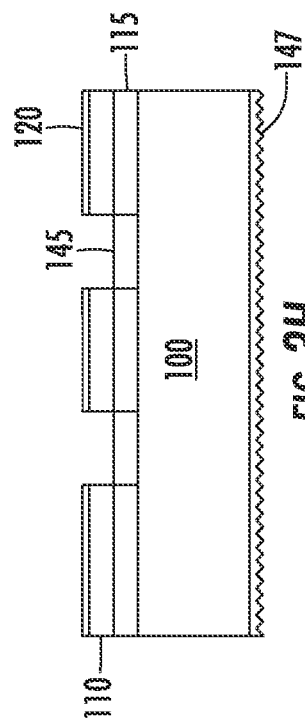
FIG. 3F
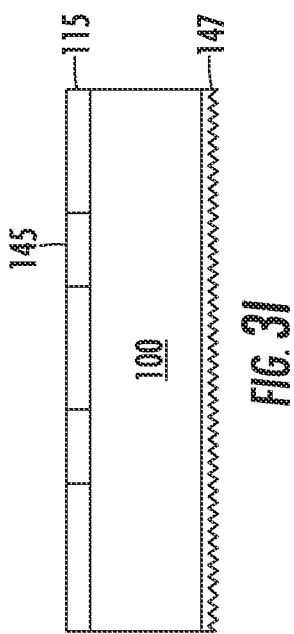
FIG. 3H
FIG. 3I
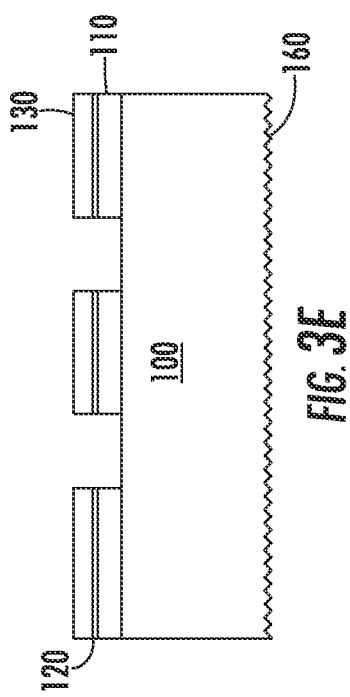
FIG. 3G

1
METHOD OF FORMING AN INTERDIGITATED BACK CONTACT SOLAR CELL

FIELD

Embodiments of the present disclosure relate to methods for forming a solar cell, and more particularly, forming an interdigitated back contact solar cell.

BACKGROUND

Solar cells are created by forming a pn junction in a semiconductor workpiece. Light energy impinging the solar cell excites electrons in the solar cell, leading to the creation of current flow. Various types of solar cells exist, including back contact solar cells, in which all of the circuit contacts are on the back surface. This may improve efficiency since the entirety of the front surface is available for receiving light energy.

However, more processing may be used to create the desired dopant pattern on the back surface of a back contact solar cell. In one embodiment, the pattern is referred to as interdigitated, where the emitter and back surface fields are complementary patterns that comprise the entirety of the back surface. For improved efficiency, it may be beneficial for the emitter and back surface fields to be aligned where one another such that gaps do not exist between them.

However, precise alignment often leads to the use of high precision equipment or multiple processes, which leads to decreased throughput, resulting in increased cost.

Therefore, it would be advantageous if there were a method of forming an interdigitated solar cell that was inexpensive and reduced the necessity for high precision processing.

SUMMARY

A method of forming an interdigitated back contact solar cell is described. The method uses a deposition process to create a doped glass layer on the substrate, which, when diffused, created either the emitter or back surface fields. The deposition process may also create an oxide layer on top of the doped glass layer. This oxide layer serves as a mask for a subsequent ion implant. This ion implant directs ions having the opposite conductivity of the doped glass layer into exposed regions of the substrate. A thermal process is used to diffuse the dopant from the doped glass layer into the substrate and repair any damage caused by the ion implant.

In one embodiment, a method of forming an interdigitated back contact solar cell is disclosed. The method comprises forming a patterned glass layer doped with a first species on a back surface of a substrate, wherein regions of the substrate are exposed; implanting ions of a second species into the substrate, the second species having a conductivity opposite that of the first species, wherein the ions implant the exposed regions but not the regions covered by the patterned glass layer; and performing a thermal process to diffuse dopant from the patterned doped glass layer into the substrate.

In a second embodiment, a second method of forming an interdigitated back contact solar cell is disclosed. The method comprises depositing a n-doped glass layer on a back surface of an n-type substrate; depositing an oxide layer on top of the n-doped glass layer; applying a mask to portions of the oxide layer; removing portions of the oxide layer and n-doped glass layer not covered by the mask, so as to expose regions of the n-type substrate; removing the mask after exposing regions of the n-type substrate; implanting p-type ions into the n-type substrate, where the p-type ions implant the exposed regions of the n-type substrate to form emitter regions and do not penetrate the n-doped glass layer beneath the oxide layer; and performing a thermal process to diffuse n-type dopant from the n-doped glass layer into the n-type substrate to form back surface fields.

In a third embodiment, a method of forming a solar cell is disclosed. The method comprises implanting ions of a first species into a substrate having a patterned glass layer doped with a second species on a back surface of the substrate, the second species having a conductivity opposite that of the first species, wherein the ions are implanted into exposed regions but not regions of the substrate covered by the patterned glass layer doped with the second species.

BRIEF DESCRIPTION OF THE FIGURES

For a better understanding of the present disclosure, reference is made to the accompanying drawings, which are incorporated herein by reference and in which:

FIGS. 1A-1I show the formation of an interdigitated back contact solar cell according to one embodiment;

FIGS. 2A-2I show the formation of a textured interdigitated back contact solar cell according to one embodiment;

FIGS. 3A-3I show the formation of a textured interdigitated back contact solar cell with a front surface field according to one embodiment;

DETAILED DESCRIPTION

As described above, interdigitated back contact (IBC) solar cells may offer improved efficiency due to the ability to utilize the entire front surface to collect light energy. However, IBC solar cells often utilize a more complex doping profile on the back surface. This doping profile includes emitter regions and back surface fields (BSFs), which are disposed adjacent to one another. A combination of deposition doping and ion implantation may be used to form the desired doping profile. This process utilizes deposited doped oxides and a single blanket ion implant to produce a back surface having both emitters and BSFs.

Figure 1A:
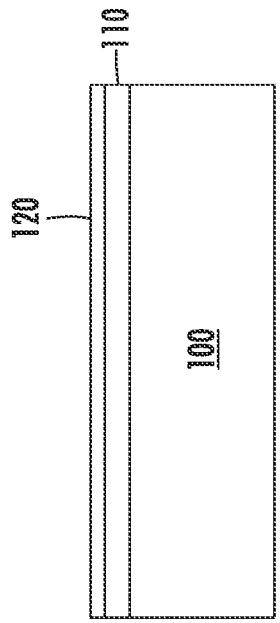

FIGS. 1A-1I show a first embodiment of a process that may be employed to create the desired dopant pattern on the back surface of a solar cell. FIG. 1A shows an n-type substrate 100. This n-type substrate 100 will be processed to create an interdigitated back contact solar cell.

Figure 1B:
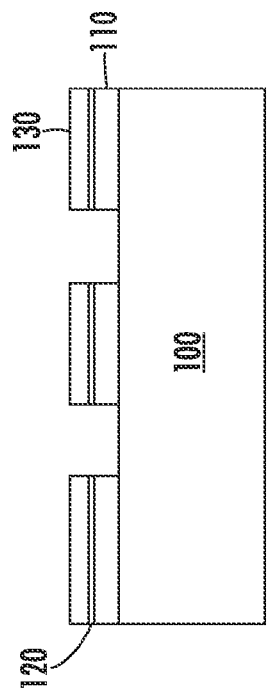

In FIG. 1B, a p-doped glass layer 110 is deposited on the n-type substrate 100. This deposition may be performed using any deposition process such as chemical vapor deposition (CVD), atmospheric pressure CVD (APCVD), low pressure CVD, plasma enhanced CVD, sputtering or other processes. In one embodiment, the p-doped glass layer 110 may be boron doped silicon dioxide, although others are within the scope of the disclosure. In that embodiment, the boron doped silicon dioxide may be formed by flowing a boron-containing gas, nitrogen dioxide and silane into the deposition chamber. In some embodiments, the boron-containing gas may be diborane. Other gases containing a p-type dopant may be used in lieu of diborane.

This deposition produces a p-doped glass layer 110 on the back surface of the n-type substrate 100. The thickness of the p-doped glass layer 110 may be about 20-200 nm, although other thicknesses are possible. The p-doped glass layer 110 may be boro-silicate glass (BSG) in some embodiments. After a sufficient thickness of p-doped glass layer 110 has been deposited, an optional oxide layer 120 may then be formed on top of the p-doped glass layer 110. The oxide layer 120 may be undoped at the time that it is deposited on the p-doped glass layer 110. In one embodiment, this is performed by interrupting the flow of the boron-containing gas into the deposition chamber, while maintaining the flow of nitrogen dioxide and silane. If formed, the oxide layer 120 may have a thickness of about 50 nm.

Figure 1C:
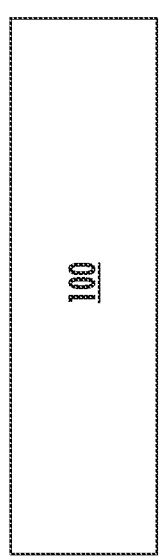

After the p-doped glass layer 110 and optionally the oxide layer 120 have been deposited, a mask 130 is applied to portions of the n-type substrate 100, as shown in FIG. 1C. The mask 130 may be screen printed on top of the oxide layer 120, using conventional techniques. The mask 130 is disposed in those portions where the emitter will ultimately be formed.

Figure 1D:
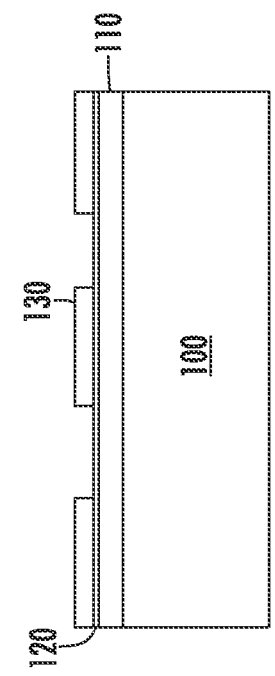

Those portions of the oxide layer 120 and p-doped glass layer 110 that are not covered by the mask 130 are then removed, as shown in FIG. 1D. This may be done using a dilute hydrofluoric etch. After this is complete, regions of the n-type substrate 100 are again exposed. These exposed regions will be formed into BSFs during a subsequent process.

Once the uncovered oxide layer 120 and p-doped glass layer 110 have been removed, the mask 130 can be removed, as shown in FIG. 1E. The mask 130 may be removed using a wet etch process, although other processes are also possible. In some embodiments, the processes of FIGS. 1D-1E may be performed using a single tool.

The n-type substrate 100 is then exposed to an ion implantation process, using n-type ions 140. In one embodiment, phosphorus ions are implanted into the n-type substrate 100, although other n-type species may be used. This implant may be a blanket implant, meaning that the entirety of the n-type substrate 100 is exposed to the n-type ions 140. In this embodiment, the oxide layer 120 serves as a mask that prevents the n-type ions 140 from penetrating the p-doped glass layer 110. Thus, the n-type ions 140 are implanted into the exposed regions of the n-type substrate 100 and into the oxide layer 120. In embodiments where an oxide layer 120 is not formed, the thickness of the p-doped glass layer 110 may be increased. This may reduce the possibility that the n-type ions 140 pass through the p-doped glass layer 110 and implant the n-type substrate 100 beneath the p-doped glass layer 110.

In an alternate embodiment, the order of the previous two processes may be reversed, such that the n-type ions 140 are implanted prior to the removal of the mask 130. This allows the n-type ions 140 to penetrate the mask 130 rather than the oxide layer 120 or the p-doped glass layer 110. However, the exposed regions of the n-type substrate 100 may become amorphized by the n-type ions 140. This may weaken the resistance of these exposed regions to the wet etch that is done to remove the mask 130. In addition, the processes of FIGS. 1D-1E cannot be combined in this embodiment.

The implantation of n-type ions 140 serves to form BSFs 145, as shown in FIG. 1G. After the n-type ions 140 are implanted, a thermal process is performed. This thermal process drives the p-type dopant from the p-doped glass layer 110 into the n-type substrate 100, creating emitter 115. The thermal process is used to repair the damage in the exposed regions caused by the ion implantation.

Various addition processes may be performed. In one embodiment, shown in FIG. 1H, the oxide layer 120 and the p-doped glass layer 110 are removed after the thermal process.

In another embodiment, these layers remain on the n-type substrate, and metallization is done on the exposed BSFs 145. In other words, the p-doped glass layer 110 and the oxide layer 120 (if present) may serve as a mask for the subsequent metallization layer. In other words, as shown in FIG. 1I, the metallization layer 180 is deposited on the exposed regions and is aligned to the BSFs 145 by the p-doped glass layer 110. This metallization layer 180 serves as the metal contacts for the BSFs 145. In a further embodiment, contact holes may be created in the p-doped glass layer 110 so that metal contacts may be formed to the emitter 115.

In yet another embodiment, the thermal process is performed in the presence of oxygen so as to form an oxide layer on the top of the BSFs 145.

FIGS. 2A-2I show the formation of an IBC solar cell having a textured front surface. Many of the process of FIG. 1A-1H are repeated in FIGS. 2A-2I. As such, description of like processes will not be repeated.

Figure 2A:
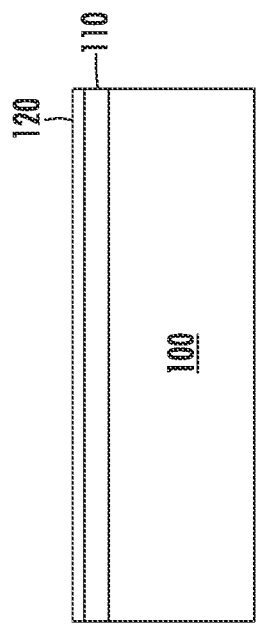
Figure 2B:
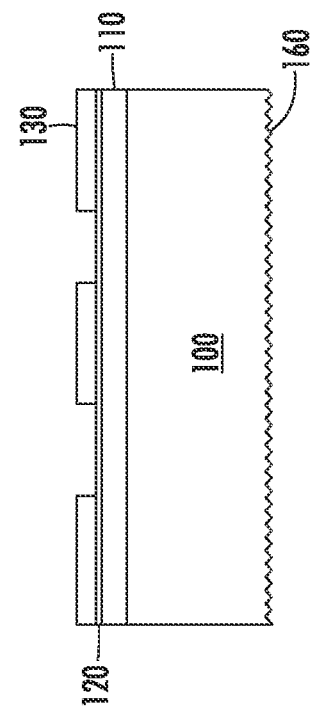
Figure 2C:
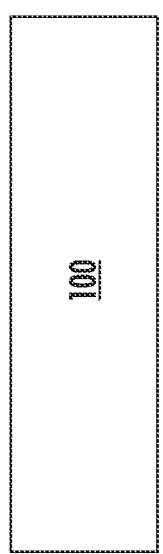
Figure 2D:
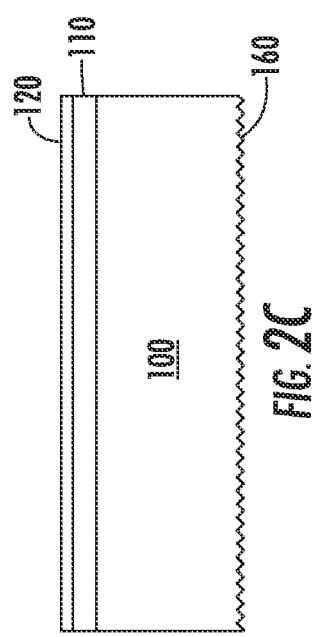

In FIGS. 2A-2B, an optional oxide layer 120 and a p-doped glass layer 110 are deposited on an n-type substrate 100, as described above. As described above, the oxide layer 120 may be undoped while it is being deposited on the p-doped glass layer 110. After these processes, but prior to the application of the mask 130, the n-type substrate 100 is exposed to a wet etch process, as shown in FIG. 2C. This wet etch process may utilize potassium hydroxide (KOH), which is known to texture silicon. The KOH creates a textured front surface 160 of the n-type substrate 100. In one embodiment, the oxide layer 120 may form an effective mask, resisting the texturing effect of the KOH on the back surface.

After the front surface is textured, the remaining processes shown in FIGS. 2D-2I are performed. These processes correspond to FIGS. 1C-1H, respectively. Additionally, a metallization process, such as that described above with respect to FIG. 1I may also be performed in this embodiment.

In another embodiment, the front surface of the n-type substrate 100 may also be doped to create a textured front surface field (FSF). FIGS. 3A-3I show processes that may be employed to create such an IBC solar cell. Again, most of the processes are the same as those explained with respect to FIGS. 1A-1H and will not be repeated.

In FIGS. 3A-3B, an optional oxide layer 120 and a p-doped glass layer 110 are deposited on an n-type substrate 100, as described above. After these processes, but prior to the application of the mask 130, a wet etch process is performed, as shown in FIG. 3C. The n-type substrate 100 is then exposed to a wet etch process. This wet etch process may utilize potassium hydroxide (KOH), which is known to texture silicon. The KOH creates a textured front surface 160 of the n-type substrate 100. In some embodiments, the oxide layer 120 may form an effective mask, resisting the texturing effect of the KOH on the back surface.

After the front surface is textured, the processes shown in FIGS. 3D-3F are performed. These processes correspond to FIGS. 1C-1E, respectively.

FIG. 3G shows an ion implantation process using n-type ions 140. Unlike the implant of FIG. 1F, n-type ions 140 are implanted into both surfaces of the n-type substrate 100. In one embodiment, after the back surface has been implanted (as described in FIG. 1F), the front surface is then implanted with a lower dose, such as about $1E14/cm^2$, of n-type ions 141. In another embodiment, the front surface is implanted with n-type ions 141 prior to the back surface.

The implantation of n-type ions 141 into the front surface allows the formation of n-doped front surface fields 147, as shown in FIG. 3H. Subsequent processes, such as the thermal process of FIG. 3H are then performed. Additionally, a metallization process, such as that described above with respect to FIG. 1I may also be performed in this embodiment.

While FIG. 3G shows the front surface of the n-type substrate 100 being implanted when the back surface is implanted, other embodiments are possible. For example, if desired, the front surface may be implanted at any time prior to the thermal process.

While the above embodiments all describe the use of a p-doped glass layer 110 and the implantation of n-type ions 140, other embodiments are also possible. For example, FIGS. 4A-4H shows a flow where an n-type glass layer is used with p-type ion implantation.

Figure 4A:
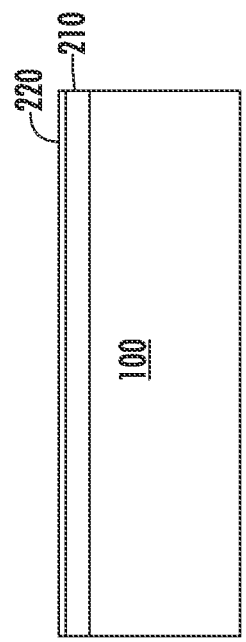
FIGS. 4A-4H show the formation of an interdigitated back contact solar cell according to another embodiment.
Figure 4B:
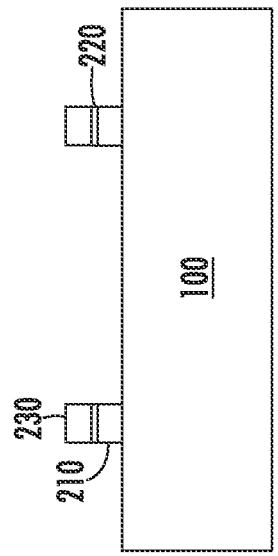

FIG. 4A shows the n-type substrate 100, similar to that used in the other embodiments. As shown in FIG. 4B, an n-doped glass layer 210 is then deposited to the n-type substrate 100. The n-doped glass layer 210 may be phosphosilicate glass (PSG). This layer may be formed by the introduction of a phosphorus-containing gas (such as phosphine), nitrogen dioxide and silane. Various processes may be used to create this n-doped glass layer 210. This deposition may be performed using any deposition process such as chemical vapor deposition (CVD), atmospheric pressure CVD (APCVD), low pressure CVD, plasma enhanced CVD, sputtering or other processes. After a sufficient thickness, such as 20-200 nm, of the n-doped glass layer 210 has been deposited, an oxide layer 220 may optionally be deposited. This oxide layer 220 may be undoped at the time that it is being deposited. This may be performed by interrupting the flow of phosphorus-containing gas to the deposition chamber, while maintaining the flow of nitrogen dioxide and silane. If formed, the oxide layer 220 may have a thickness of about 50 nm.

Figure 4C:
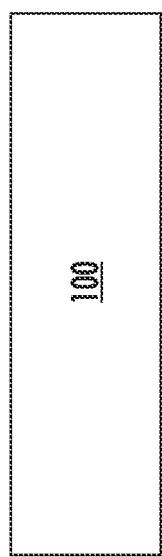

After the n-doped glass layer 210 and the optional oxide layer 220 have been deposited, a mask 230 is applied to the n-type substrate 100, as shown in FIG. 4C. The mask 230 may be screen printed on top of the oxide layer 220 or the n-doped glass layer 210, using conventional techniques. The mask 230 is disposed in those locations where the back surface fields will ultimately be formed. Since the majority of the back surface of an IBC solar cell may be an emitter region, the amount of mask 230 may be less than that used in the embodiments described previously.

Figure 4D:
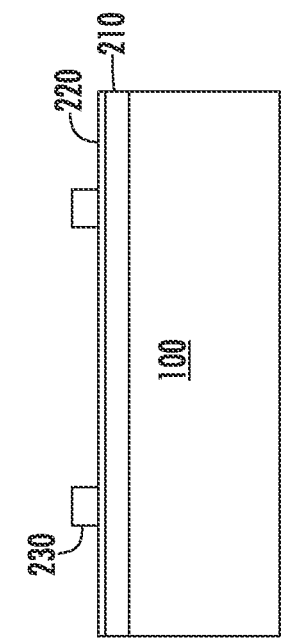

Those regions of the oxide layer 220 and n-doped glass layer 210 that are not covered by the mask 230 are then removed, as shown in FIG. 4D. This may be done using a dilute hydrofluoric etch. After this is complete, regions of the n-type substrate 100 are again exposed. These exposed regions will be formed into emitters during a subsequent process.

Figure 4E:
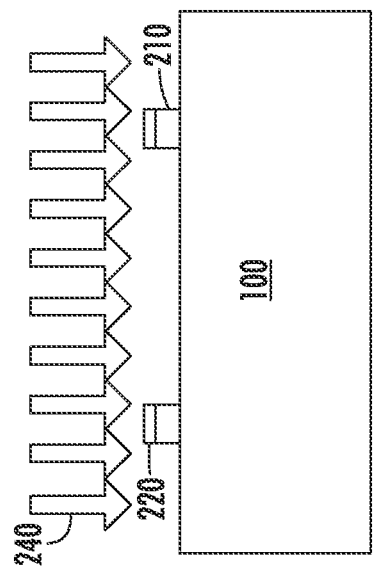
Figure 4F:
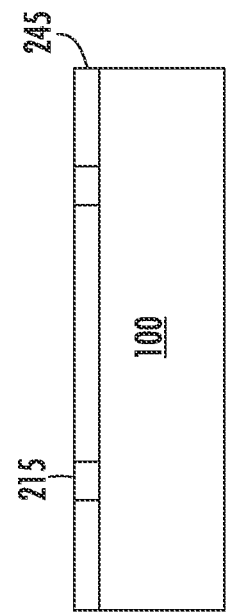

Once the uncovered oxide layer 220 and n-doped glass layer 210 have been removed, the mask 230 can be removed, as shown in FIG. 4E. The mask 230 may be removed using a wet etch process, although other processes are also possible. In some embodiments, the processes of FIGS. 4D-4E may be performed using a single tool.

The n-type substrate 100 is then exposed to an ion implantation process, using p-type ions 240. In one embodiment, boron ions are implanted into the n-type substrate 100, although other p-type species may be used. This implant may be a blanket implant, meaning that the entirety of the n-type substrate 100 is exposed to the p-type ions 240. In one embodiment, the oxide layer 220 serves as a mask that prevents the p-type ions 240 from penetrating the n-doped glass layer 210. Thus, the p-type ions 240 are implanted into the exposed regions of the n-type substrate 100 and into the oxide layer 220. In an embodiment that does not include an oxide layer 220, the thickness of the n-doped glass layer 210 may be increased. This increase in thickness may reduce the possibility that p-type ions 240 will pass through the n-doped glass layer 210 and implant the n-type substrate 100 beneath the n-doped glass layer 210.

In an alternate embodiment, the order of the previous two processes may be reversed, such that the p-type ions 240 are implanted prior to the removal of the mask 230. This allows the p-type ions 240 to penetrate the mask 230 rather than the oxide layer 220 or the n-doped glass layer 210. In addition, the processes of FIGS. 4D-4E cannot be combined in this embodiment.

Figure 4G:
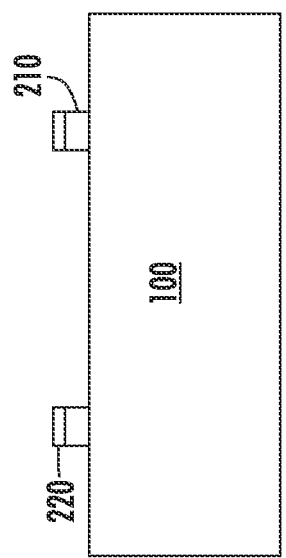
Figure 4H:
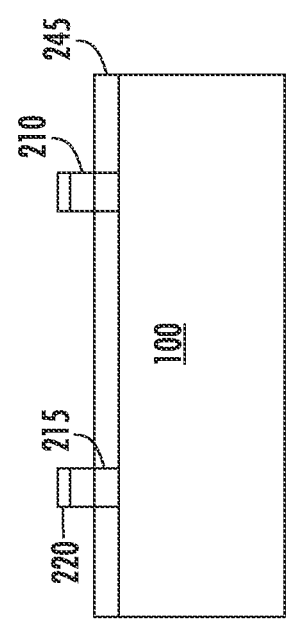

The implantation of p-type ions 240 creates the emitter 245, as shown in FIG. 4G. After the p-type ions 240 are implanted, a thermal process is performed. This thermal process drives the dopant into the n-type substrate 100, creating emitter 245 and BSFs 215. The thermal process is used to repair any damage in the exposed regions caused by the ion implantation. In addition, the thermal process drives the n-type dopant from the n-doped glass layer 210 into the n-type substrate 100.

Various additional processes may be performed. In one embodiment, shown in FIG. 4H, the oxide layer 220 and the n-doped glass layer 210 are removed after the thermal process.

In another embodiment, these layers remain on the n-type substrate, and metallization is done on the exposed emitters 245. In other words, the n-doped glass layer 210 and the oxide layer 220 (if present) serve as a mask for the subsequent metallization layer. This may be performed as shown in FIG. 1I.

In yet another embodiment, the thermal process is performed in the presence of oxygen so as to form an oxide layer on the top of the emitters 245.

Additionally, the embodiment shown in FIGS. 4A-4H can be modified to include a texturing process, during which the front surface of the n-type substrate is textured. This may be done in substantially the same manner as was described with respect to FIG. 2C. The embodiment of FIG. 4A-4H may also be modified to include an implantation process wherein a front surface field is created. In this embodiment, unlike that described in connection with FIG. 3G, two different ion species are used. The back surface is implanted with p-type ions 240, as described above. However, the front surface is implanted with n-type ions 141. In addition, the dose of each species may be different during these two implantation processes.

Figure 5:
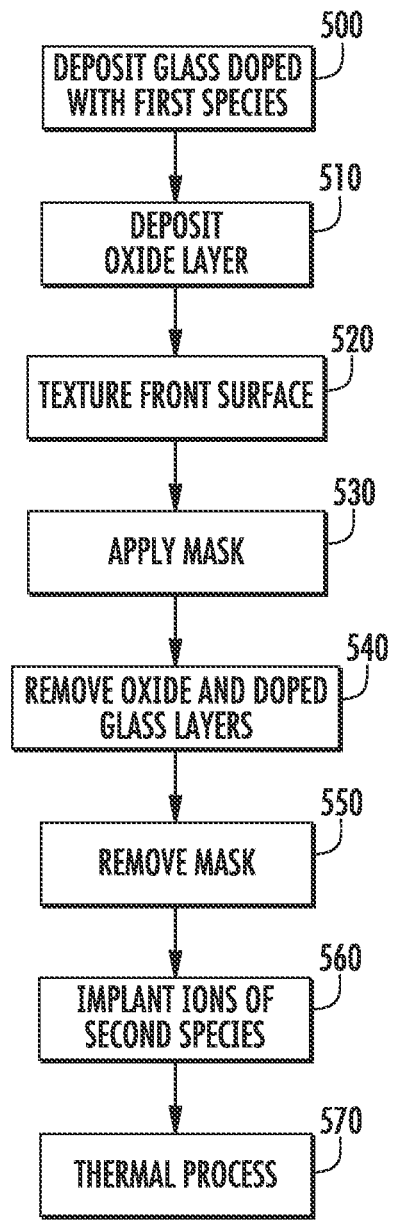
FIG. 5 shows a generic process flow for the formation of an interdigitated back contact solar cell.

FIG. 5 shows a flowchart of the various processes used to create the IBC solar cell described herein. First, as described above, a glass layer doped with a first species is deposited on an n-type substrate 100, as shown in Process 500. An oxide layer is optionally then deposited on top of the doped glass layer, as shown in Process 510. As described above, this oxide layer may be undoped at the time that it is deposited on the glass layer. Optionally, a texturing process 520 is performed after the deposition of the oxide layer. A mask is then applied to the oxide layer as shown in Process 530. A removal process 540 is then performed to remove the oxide layer and doped glass layer that are not covered by the mask. The mask is then removed, as shown in Process 550. An ion implant 560 is then performed on the n-type substrate. This ion implant uses a second species having the opposite conductivity of the first species. Thus, if a p-doped glass is deposited, then an n-type ion is implanted. Conversely, if an n-doped glass is deposited, then a p-type ion is implanted. In some embodiments, such as that shown in FIG. 3G, n-type ions may be implanted into the front surface as well. As described above, the order of Processes 550 and 560 may be reversed if desired. Following these processes, a thermal process 570 is used to diffuse the dopants into the n-type substrate and to repair damage caused by the ion implantation. As described above, other processes may be performed after the thermal process 570.

In FIG. 5, the processes 500-550 are used to form a patterned glass layer doped with a first species on the top of the n-type substrate 100. An optional patterned oxide layer is disposed on top of the patterned doped glass layer. However, other processes may be used to form a patterned glass layer doped with a first species on the back surface of a substrate.

For example, in another embodiment, a mask may be applied to the substrate prior to the deposition of the doped glass layer and optional oxide layer. The doped glass layer and the optional oxide layer that is disposed on the mask is then lifted off or otherwise removed.

In another embodiment, a shadow mask is positioned above the substrate during the deposition process so that the doped glass layer and the oxide layer are only deposited on certain portions of the substrate. After the deposition is complete, the shadow mask is removed.

In yet another embodiment, a doped glass layer and optionally an oxide layer are deposited on the back surface of the n-type substrate 100 as described above. An etchant is then printed or otherwise patterned on the top of these layers. The etchant is then activated, causing it to remove the doped glass layer and the oxide layer. After the layers have been removed to the desired thickness, the etchant is then removed.

In another embodiment, a doped glass layer and an optional oxide layer are deposited on the back surface of the n-type substrate 100 as described above. Laser patterning is then used to remove the layers to expose portions of the substrate. A wet etch process may optionally be used to repair any damage caused by the laser.

The above description recites the use of an n-type substrate. However, the disclosure is not limited to this embodiment. Other substrates may also be used.

The processes described herein are advantageous as the oxide layer and/or the doped glass layer serves as a mask for the subsequent ion implantation. This avoids the need for a separate patterned implant and also avoids the need to align the mask for the ion implantation to the previously diffused dopant. More specifically, the present methods allow a hybrid approach to the creation of an IBC solar cell, where the glass and oxide layers that are created during the diffusion process serve as masks for a subsequent ion implantation without the need for further alignment or masks. Additionally, in some embodiments, the oxide layer and/or glass layer also serve as a mask for a subsequent metallization process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming an interdigitated back contact solar cell, comprising:
    forming a patterned glass layer doped with a first species on a back surface of a substrate, wherein regions of the substrate are exposed;
    implanting ions of a second species into the substrate, the second species having a conductivity opposite that of the first species, wherein the ions implant the exposed regions but not the regions covered by the patterned glass layer;
    performing a thermal process to diffuse dopant from the patterned doped glass layer into the substrate; and
    applying metal to the exposed regions of the substrate after the thermal process, wherein the patterned glass layer is doped with a p-type dopant, and further comprising creating a hole in the patterned glass layer and applying metal in the hole after the thermal process to contact an emitter disposed beneath the patterned glass layer.

2. The method of claim 1, wherein the first species is boron and the second species is phosphorus.

3. The method of claim 1, wherein the first species is phosphorus and the second species is boron.

4. The method of claim 1, wherein an oxide layer is deposited on top of the patterned doped glass layer.

5. The method of claim 1, wherein the forming comprises:
    depositing a doped glass layer on the back surface of the substrate;
    depositing an oxide layer on top of the doped glass layer;
    applying a mask to portions of the oxide layer;
    removing portions of the oxide layer and doped glass layer not covered by the mask, so as to expose regions of the substrate; and
    removing the mask after exposing regions of the substrate.

6. The method of claim 5, wherein the mask is screen printed on portions of the oxide layer.

7. The method of claim 5, wherein the doped glass layer is deposited by introducing a plurality of gasses into a deposition chamber, wherein one of the plurality of gases contains the first species and wherein the oxide layer is deposited by interrupting a flow of the gas containing the first species into the deposition chamber after the doped glass layer has been deposited.

8. The method of claim 1, wherein the forming comprises:
    depositing a glass layer doped with a first species; and
    using a laser to pattern the doped glass layer so as to expose regions of the n-type substrate.

9. The method of claim 4, further comprising:
    texturing a front surface of the substrate using a wet etch process after the oxide layer is deposited.

10. The method of claim 1, further comprising:
    implanting n-type ions into a front surface of the substrate prior to the thermal process.

11. A method of forming an interdigitated back contact solar cell, comprising:

forming a patterned glass layer doped with a first species on a back surface of a substrate, wherein regions of the substrate are exposed;

implanting ions of a second species into the substrate, the second species having a conductivity opposite that of the first species, wherein the ions implant the exposed regions but not the regions covered by the patterned glass layer;

depositing an oxide layer on top of the patterned doped glass layer and texturing a front surface of the substrate using a wet etch process after the oxide layer is deposited; and performing a thermal process to diffuse dopant from the patterned doped glass layer into the substrate.

12. The method of claim 11, wherein the first species is boron and the second species is phosphorus.

13. The method of claim 11, wherein the first species is phosphorus and the second species is boron.

14. A method of forming an interdigitated back contact solar cell, comprising:

forming a patterned glass layer doped with a first species on a back surface of a substrate, wherein regions of the substrate are exposed;

implanting ions of a second species into the substrate, the second species having a conductivity opposite that of the first species, wherein the ions implant the exposed regions but not the regions covered by the patterned glass layer;

performing a thermal process to diffuse dopant from the patterned doped glass layer into the substrate; and wherein the forming comprises:

positioning a shadow mask above the substrate;

depositing a doped glass layer on the back surface of the substrate, where the shadow mask creates exposed regions of the substrate; and removing the shadow mask.

15. The method of claim 14, wherein the first species is boron and the second species is phosphorus.

16. The method of claim 14, wherein the first species is phosphorus and the second species is boron.

* * * * *